(12) United States Patent
Hachigo

(10) Patent No.: US 7,554,175 B2
(45) Date of Patent: Jun. 30, 2009

(54) GALLIUM NITRIDE SUBSTRATE, AND GALLIUM-NITRIDE-SUBSTRATE TESTING AND MANUFACTURING METHODS

(75) Inventor: Akihiro Hachigo, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 118 days.

(21) Appl. No.: 11/686,364

(22) Filed: Mar. 15, 2007

(65) Prior Publication Data

US 2007/0228521 A1  Oct. 4, 2007

(30) Foreign Application Priority Data

Mar. 15, 2006  (JP) ............................. 2006-071140

(51) Int. Cl.
*H01L 21/304* (2006.01)
*H01L 21/302* (2006.01)
*H01L 27/06* (2006.01)

(52) U.S. Cl. .............................. 257/617; 257/E27.012; 257/E21.214; 257/E21.237; 438/959

(58) Field of Classification Search ................. 257/617, 257/E27.012, E21.214, E21.237; 438/959
See application file for complete search history.

(56) References Cited

U.S. PATENT DOCUMENTS

2005/0184299 A1* 8/2005 Matsumura et al. ........... 257/79
2007/0051968 A1* 3/2007 Yamamoto et al. ........... 257/99

FOREIGN PATENT DOCUMENTS

| JP | H10-242230 A | 9/1998 |
| JP | 2004-143000 A | 5/2004 |
| JP | 3581145 B1 | 7/2004 |

* cited by examiner

*Primary Examiner*—Victor A Mandala
(74) *Attorney, Agent, or Firm*—James W. Judge

(57) ABSTRACT

Fracture-resistant gallium nitride substrate, and methods of testing for and manufacturing such substrates are made available. A gallium nitride substrate (10) is provided with a front side (12) polished to a mirrorlike finish, a back side (14) on the substrate side that is the opposite of the front side (12). A damaged layer (16) whose thickness d is 30 μm or less is formed on the back side (14). Given that the strength of the front side (12) is $I_1$ and the strength of the back side (14) is $I_2$, then the ratio $I_2/I_1$ is 0.46 or more.

3 Claims, 3 Drawing Sheets

GALLIUM NITRIDE SUBSTRATE, AND GALLIUM-NITRIDE-SUBSTRATE TESTING AND MANUFACTURING METHODS

BACKGROUND OF THE INVENTION

1. Technical Field

The present invention relates generally to gallium nitride substrates, and to methods of testing and manufacturing gallium nitride substrates.

2. Description of the Related Art

Gallium nitride substrates are ordinarily manufactured in the following way, as taught, for example, in Japanese Pat. No. 3581145. Initially, an ingot composed of gallium nitride is subjected to a grinding process to make it cylindrical. Next, a notch or orientation flat is formed on the lateral side of the cylindrical ingot for determining its crystal orientation. The notch consists of a V-shaped indent, while the orientation flat is a surface ground parallel to a predetermined crystal plane. Subsequently, the ingot is sliced using a cutting device such as an inner-circumferentially bladed slicer, or a wire saw, to yield a gallium nitride substrate. After that, the substrate edges are chamfered, and then a lapping (mechanical polishing) process is carried out on the substrate back side. The manufacturing procedure continues with a polishing operation (planarization process) carried out on the substrate front side to produce a mirrorlike finish, after which the substrate is washed. A gallium nitride substrate provided with a mirrorlike surface on which devices can be formed is thereby produced.

When the back side of a gallium nitride substrate is finish-processed, it is common for contaminants to cling to the back side, and for a damaged layer containing distortions and cracks to form on the back side. Gallium nitride substrates are consequently susceptible to fracturing, such that improving manufacturing yields has been difficult.

BRIEF SUMMARY OF THE INVENTION

An object of the present invention is to afford fracture-resistant gallium nitride substrates, and methods of testing for and manufacturing the gallium nitride substrates.

To resolve the problems described above, a gallium nitride substrate of the present invention is provided with a first surface polished to a mirrorlike finish, and a second surface on the side that is the opposite of the first-surface side, with a damaged layer of 30 μm thickness or less being formed on the second surface; wherein, letting the strength of the first surface be $I_1$ and that of the second surface be $I_2$, the ratio $I_2/I_1$ is 0.46 or more.

Alternatively, a gallium nitride substrate of the present invention is provided with a first surface polished to a mirrorlike finish, and a second surface on the side that is the opposite of the first-surface side, with a damaged layer of 10 μm thickness or less being formed on the second surface; wherein, letting the strength of the first surface be $I_1$ and that of the second surface be $I_2$, the ratio $I_2/I_1$ is 0.69 or more.

In accordance with the present invention, fracture-resistant gallium nitride substrates are obtained. If the thickness of damaged layer exceeds 30 μm, the gallium nitride substrate becomes susceptible to fracturing. Likewise, if the ratio $I_2/I_1$ is less than 0.46 the gallium nitride substrate is liable to break.

Furthermore, warpage of the gallium nitride substrate tends to increase if the thickness of the damaged layer exceeds 10 μm, or if the ratio $I_2/I_1$ is less than 0.69.

A gallium-nitride-substrate testing method of the present invention includes: a step of measuring the strength of a first surface of a gallium nitride substrate, and the strength of a second surface on the side that is the opposite of the first-surface side; a step of measuring the thickness of a damaged layer formed on the second surface; and a step of determining that the substrate is a conforming product if the thickness of the damaged layer is 30 μm or less, and if, letting the strength of the first surface be $I_1$ and that of the second surface be $I_2$, the ratio $I_2/I_1$ is 0.46 or more.

Herein, measuring the strengths of the first and second surfaces may precede measuring the thickness of the damaged layer, and vice-versa.

A gallium nitride substrate determined to be a conforming product according to the testing method of the present invention is fracture-resistant, as explained in the foregoing.

A gallium-nitride-substrate manufacturing method of the present invention includes: a step of polishing a first surface of the gallium nitride substrate to a mirrorlike finish; a step of processing a second surface on the side that is the opposite of the first-surface side, to form a damaged layer on the second surface; and a step of etching the damaged layer so that the thickness of the damaged layer will be 30 μm or less, and so that, letting the strength of the first surface be $I_1$ and the strength of the second surface be $I_2$, the ratio $I_2/I_1$ will be 0.46 or more.

Herein, the step of polishing the first surface to a mirrorlike finish may be executed at any time. For example, this step may be executed prior to the step of forming the damaged layer, may be executed between the step of forming the damaged layer and the step of etching the damaged layer, or may be executed after the step of etching the damaged layer.

In accordance with the manufacturing method of the present invention, fracture-resistant gallium nitride substrates are obtained.

The present invention affords fracture-resistant gallium nitride substrates and methods of testing for and manufacturing the gallium nitride substrates.

From the following detailed description in conjunction with the accompanying drawings, the foregoing and other objects, features, aspects and advantages of the present invention will become readily apparent to those skilled in the art.

DETAILED DESCRIPTION OF THE INVENTION

The following explains embodiments of the present invention in detail with reference to the accompanying drawings. It is to be noted that, in the description of the drawings, with identical reference marks being used on identical or equivalent elements, redundant explanations will be omitted.

Figure 1:
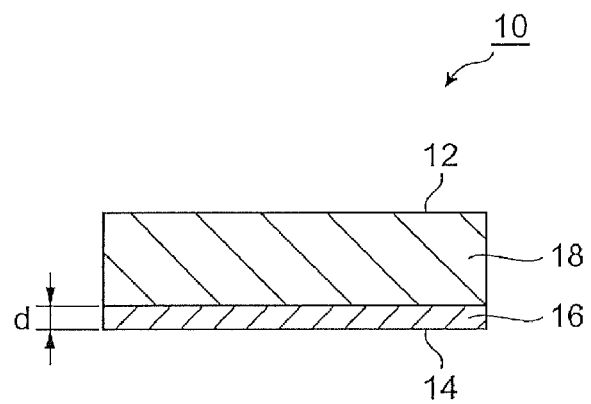
FIG. 1 is a section diagram schematically representing a gallium nitride substrate involving the present invention.

FIG. 1 is a schematic cross-sectional view illustrating a gallium nitride substrate involving the embodiments. The gallium nitride substrate 10 illustrated in FIG. 1 is, for example, a 2-inch diameter GaN wafer. The gallium nitride substrate 10 preferably consists of hexagonal or cubic single-crystal GaN. Examples of hexagonal single-crystal GaN include GaN having a Wurtzite structure. Present in hexagonal single crystal GaN are: the (0001) plane, referred to as the C-plane; the (10$\bar{1}$0) plane, referred to as the M-plane; the (11$\bar{2}$0) plane, referred to as the A-plane; the (01$\bar{1}$2) plane, referred to as the R-plane; and the (10$\bar{1}$1) plane, referred to as the S-plane. The gallium nitride substrate 10 may contain atomic elements other than gallium atoms and nitrogen atoms. The gallium nitride substrate 10 widthwise is preferably [0001]-oriented, but may be off-oriented.

The gallium nitride substrate 10 is provided with a front side 12 (first surface) polished to a mirrorlike finish, and a back side 14 (second surface) on the side opposite from the front side 12. The front side 12 is for example the Ga face, and the back side 14 is the N face. It will be appreciated that the front side 12 may be the N face and the back side 14 may be Ga face. It is preferable that devices be formed on the front side 12. Examples of devices include light-emitting devices such as LEDs and laser diodes, electron devices, and semiconductor sensors. It is preferable that chamfering be implemented on the edges of the front side 12 and the back side 14.

A damaged layer 16 including distortions and cracks is formed on the back side 14. As a result, a section 18 that has not undergone damage remains on the front side 12. The damaged layer 16 is formed in the manufacture of the gallium nitride substrate 10; it is formed for example by processing—for instance, by mechanical polishing—the gallium nitride substrate. It is preferable that the damaged layer not be formed on the front side 12.

The thickness d of the damaged layer 16 is more than 0 μm and less than or equal to 30 μm, preferably less than or equal to 10 μm. Herein, the thickness d of the damaged layer 16 is calculated for example as follows. At first the gallium nitride substrate 10 is sliced to expose a cross-section of the substrate. Subsequently, the cathodoluminescence of the cross-section is measured to create a two-dimensional map of the cathodoluminescent intensity. On the map, the region in which the cathodoluminescense intensity is below a predetermined threshold (non-light-emitting region) is the damaged layer 16. The thickness of the damaged layer 16 preferably is measured in several places on the back side 14 of the gallium nitride substrate 10, and the average taken as the thickness d of the damaged layer 16.

Here, the gallium nitride substrate 10 cross-section may be immersed in a fluorescent material such as rhodamine B ($C_{28}H_{31}O_3N_{21}Cl$), for example, and the region where the pigment has penetrated taken to be the damaged layer 16. Alternatively, the gallium nitride substrate 10 cross-section may be irradiated with X-rays to scan the cross-section thickness-wise with the X-rays, and, utilizing the X-ray diffraction spectra obtained, the thickness d of the damaged layer 16 may be calculated from the displacement of the positions of the spectral peaks.

It is further preferable that, letting the strength of the front side 12 be $I_1$ and that of the back side 14 be $I_2$, the ratio $I_2/I_1$ be 0.46 or more, especially 0.69 or more. The force at which the gallium nitride substrate 10 fractures when a load is applied to the front side 12 is used as the strength ($I_1$) of the front side 12. Likewise, the force at which the gallium nitride substrate 10 fractures when a load is applied to the back side 14 is used as the strength ($I_2$) of the back side 14.

Figure 2:
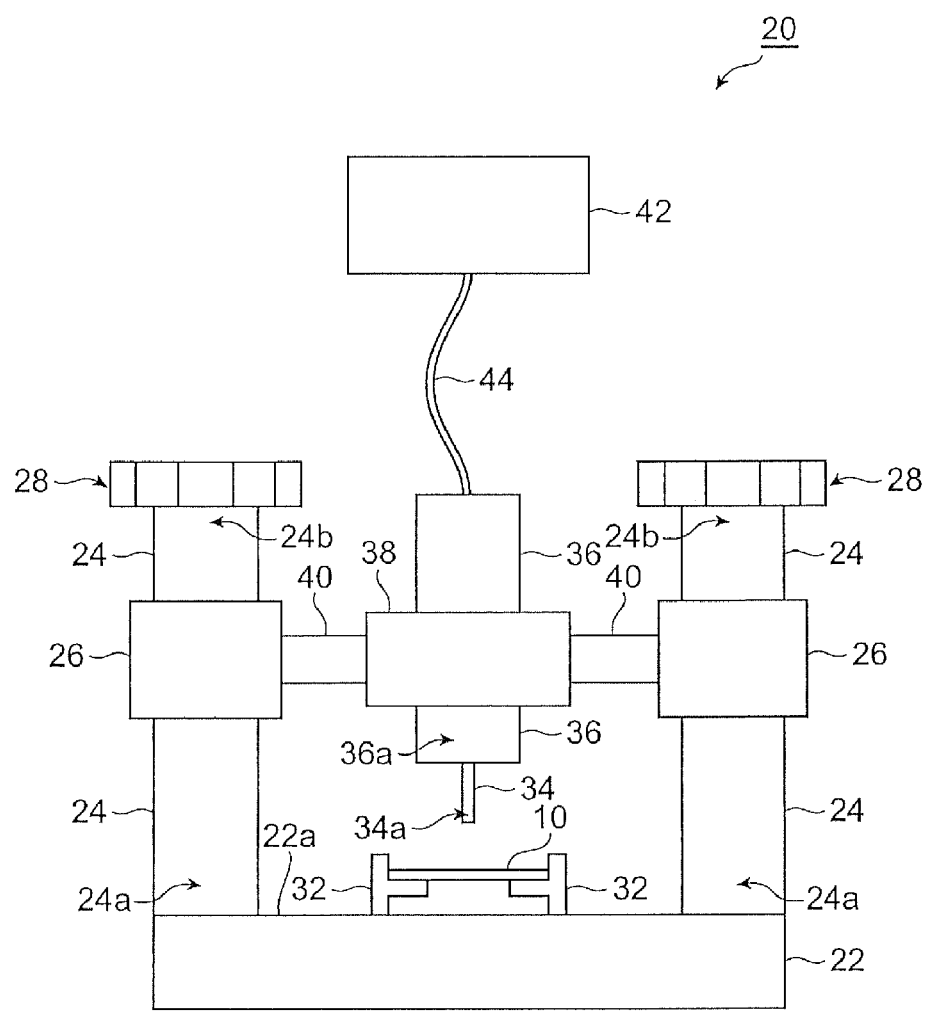
FIG. 2 is a diagram schematically illustrating one example of a strength measurement device for measuring the strength of the front side and of the back side of a gallium nitride substrate.

FIG. 2 is a schematic diagram illustrating one example of a strength measurement device for measuring the strength of the front and back sides of a gallium nitride substrate. The strength measurement device 20 illustrated in FIG. 2 is provided with a stage 22, a substrate holder 32 set on the stage 22 to support the gallium nitride substrate 10, and a digital force gauge 36 located over the gallium nitride substrate 10. Gallium nitride substrates for testing in the strength measurement device 20 preferably are 50 mm in diameter and 350 μm in thickness. The substrate holder 32 retains the gallium nitride substrate 10 so that the planar orientation of the substrate 10 approximately parallels surface 22a of the stage 22.

Lower ends 24a of a plurality of arms 24 are fixed to the stage 22, and clamps 26 are respectively attached to the plurality of arms 24. Support bars 40 for retaining the digital force gage 36 are anchored to the clamps 26. The support bars 40 secure the digital force gage 36 via the clamp 38. A rod 34 is mounted on the lower end 36a of the digital force gage 36. The rod 34, which is, for example, cylindrical with a diameter of 10 mm, preferably has a hemispheroidal tip 34a of 5 mm radius (R). The tip 34a of the rod 34 may be flat. The position of the tip 34a of the rod 34 adjusted with adjusting screws 28 attached to the upper ends 24b of the arms 24. The strength measurement device is zeroed by having the site where the tip 34a of the rod 34 has contacted the gallium nitride substrate 10 be the zero point. The digital force gauge 36 is hooked up to a digital monitor 42 through a cable 44. The digital monitor 42 monitors the amount by which the rod 34 is pressed in.

When the strength of the front side 12 of the gallium nitride substrate 10 is to be measured, the gallium nitride substrate 10 is placed on the substrate holder 32 so that the tip 34a of the rod 34 will contact the front side 12. The tip 34a of the rod 34 is pressed onto the front side 12, and the load when the gallium nitride substrate 10 fractures is taken as the strength of the front side 12. In the same way, placing the gallium nitride substrate 10 on the holder 32 so that the tip 34a of the rod 34 will contact the back side 14 allows the strength of the back side 14 to be measured.

As explained in the forgoing, in the gallium nitride substrate 10 of the present invention, the thickness d of the damaged layer 16 is 30 μm or less, and the ratio $I_2/I_1$ is 0.46 or more. The gallium nitride substrate is therefore extraordinarily fracture-resistant. For this reason, in fabricating devices on the front side 12, the gallium nitride substrate 10 is not liable to break, such that device-fabrication yields improve. If the thickness d of damaged layer 16 exceeds 30 μm, then the gallium nitride substrate 10 is prone to fracturing. And if the ratio $I_2/I_1$ is less than 0.46, then the gallium nitride substrate 10 is liable to break.

Moreover, having the thickness d of the damaged layer 16 be 10 μm or less and the ratio $I_2/I_1$ be 0.69 or more particularly minimizes warpage of the gallium nitride substrates 10. Herein, having the substrate warpage be 10 μm or less allows device to be formed optimally. If the thickness d of the damaged layer 16 exceeds 10 μm, warpage of the gallium nitride substrates 10 tends to increase. By the same token, if the ratio $I_2/I_1$ is less than 0.69, warpage of the gallium nitride substrates 10 also tends to increase.

FIG. 3 is a schematic cross-sectional view illustrating steps in a gallium-nitride-substrate manufacturing method involving the embodiments. The following explains a method of manufacturing the gallium nitride substrate 10 as one example of a gallium-nitride-substrate manufacturing method involving the embodiments.

Substrate Preparation Step

Figure 3A:
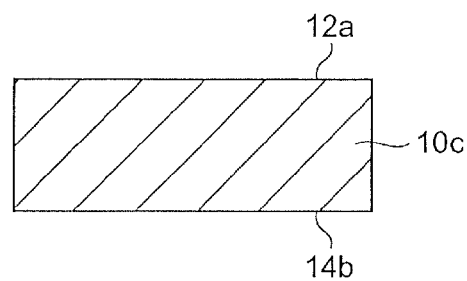
FIG. 3 is process-step section diagrams schematically illustrating a gallium-nitride-substrate manufacturing method involving the present invention.
Figure 3B:
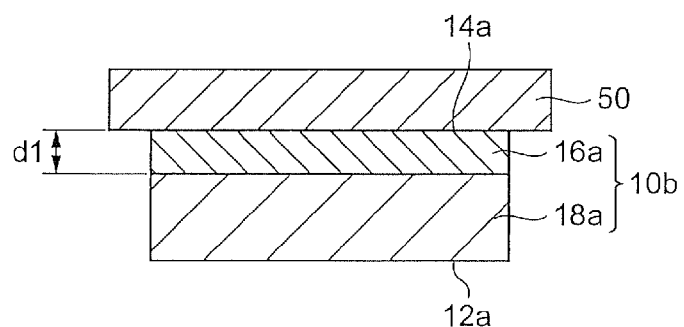
Figure 3C:
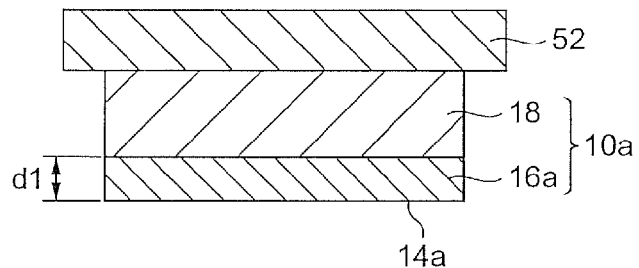
Figure 3D:
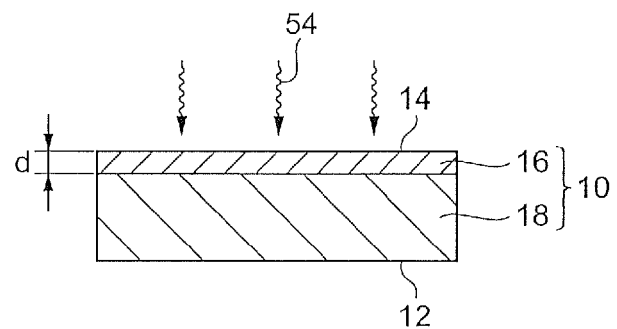

Initially, a gallium nitride substrate 10c provided with the front side 12a and the back side 14b as illustrated in FIG. 3A is readied. The gallium nitride substrate 10c is obtained for example as follows. At first an ingot composed of gallium nitride is cut to remove the ends from the ingot, which is subjected to a grinding process to make it cylindrical in form until it has a desired diameter. Next, as needed an orientation flat for determining the crystal orientation is formed on the lateral side of the cylindrical ingot. The orientation flat is a ground surface paralleling a predetermined crystal face. It will be appreciated that a notch may be formed as a substitute for the orientation flat. Subsequently, the ingot is sliced using a cutting device such as an inner-circumferentially bladed slicer, or a wire saw, to obtain substrates. Preferably, the substrate edges are thereafter chamfered. Chamfering enables incidents of cracking and fracturing in the edges to be minimized.

Mechanical Polishing Step

Next, the back side 14b of the gallium nitride substrate 10c is mechanically polished (lapping process) as illustrated in FIG. 3. This mechanical polishing leaves a d1-thick the damaged layer 16a including distortions and cracks on the back side 14b of the gallium nitride substrate 10c. As a result, a gallium nitride substrate 10b provided with the back side 14a having a given surface roughness is obtained. An undamaged section 18a remains on the front side 12a of the gallium nitride substrate 10c. A grinding wheel 50 that has a diamond abrasive is preferably employed for the polishing operation.

It should be understood that the front side 12a of the gallium nitride substrate 10c may be polished mechanically. Although polishing the front side 12a mechanically leaves a damaged layer also on the front side 12a, the layer is removed by a planarization process as described later.

Planarization Step

Next, the front side 12a of the gallium nitride substrate 10b is planarized to a mirrorlike finish (polishing process) as illustrated in FIG. 3, whereby a gallium nitride substrate 10a provided with the front side 12 polished into a mirrorlike finish is obtained. A nonwoven fabric pad 52, for example, is preferably employed in the planarization process.

Etching Step

Next, the damaged layer 16a is etched to yield a damaged layer 16 whose thickness d is 30 µm or less and in which the ratio $I_2/I_1$ is 0.46 or more. The gallium nitride substrate 10 preferably is etched before being cleaned. As for the etching, two types of etch processes are available: dry and wet etch. Lengthening the etching time is an exemplary way to reduce the thickness d of the damaged layer 16. And reducing thickness d allows the ratio $I_2/I_1$ to be increased. Furthermore, varying average grain diameter of the grit in the grinding wheel 50 adjusts the ratio $I_2/I_1$.

In dry etch, reactive ion etching (RIE) preferably is employed. Ar gas, for example, preferably is employed under the conditions: power 200 W, pressure $10 \times 10^{-3}$ torr (1 torr=133.322 Pa) to generate active species, with which dry etching is performed.

In wet etch, warmed strong alkalis or acids preferably are employed as the etching solution. Such strong alkalis include NaOH and KOH. Such strong acids include $H_3PO_4$. Generally in wet etch, the Ga face is hardly etched, but the N face is selectively etched. Therefore, if the back side 14a is the N face, immersing the gallium nitride substrate 10a into an etching solution makes it possible to selectively etch the damaged layer 16a formed on the back side 14a. This selective etching increases the ratio $I_2/I_1$.

A manufacturing run through the foregoing processes yields extraordinarily fracture-resistant gallium nitride substrates 10. It should be understood that planarization step may precede the mechanical polishing step, or may follow the etching step.

Figure 4:
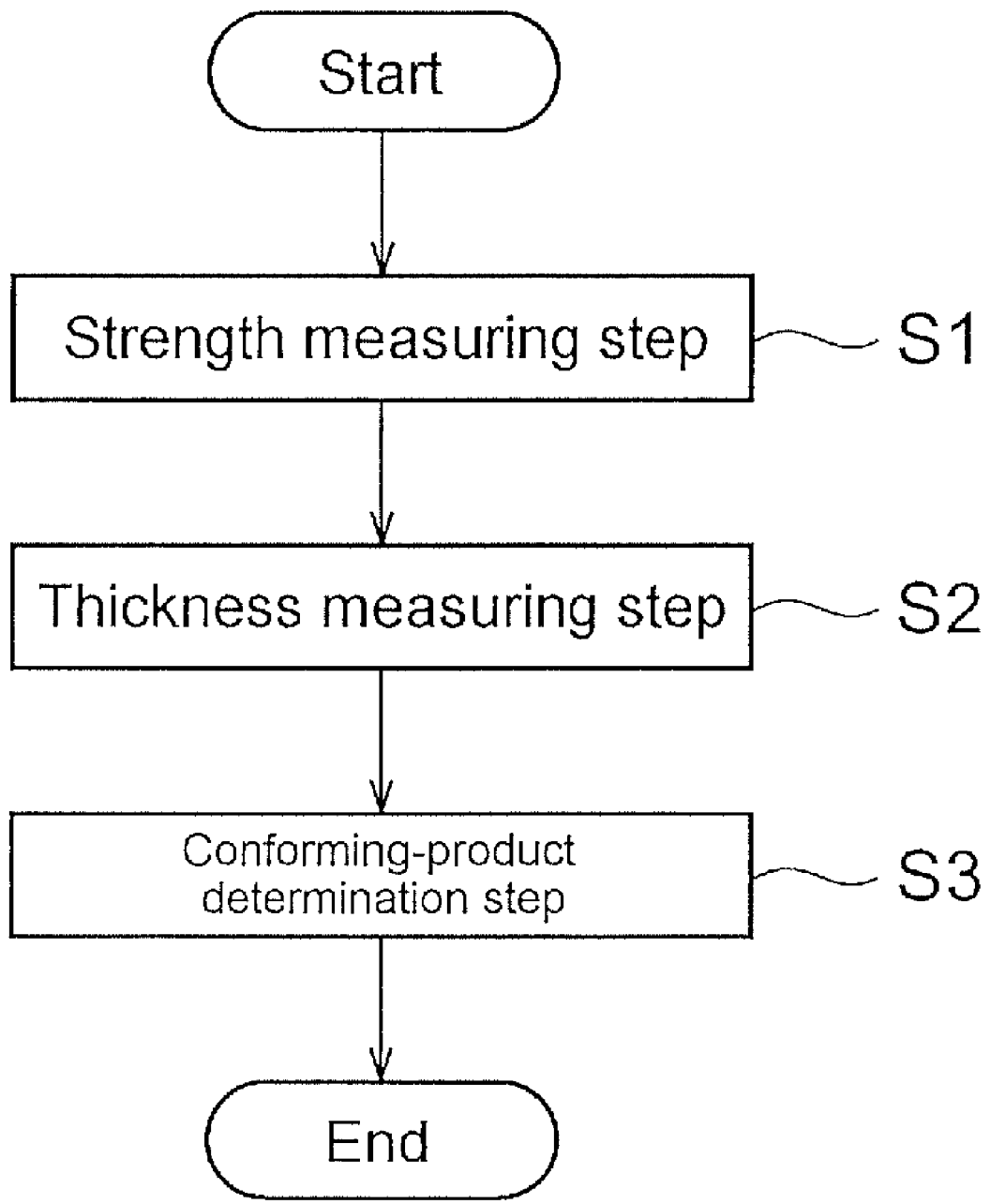
FIG. 4 is a flow chart outlining a gallium-nitride-substrate testing method involving the present invention.

FIG. 4 is a schematic flow chart depicting a gallium-nitride-substrate testing method involving the embodiments. The following explains, with reference to FIG. 1, a method of testing gallium nitride substrates 10 as one example of a gallium-nitride-substrate testing method involving the embodiments.

This testing method comprises the following steps: measuring the strength ($I_1$) of the front side 12 and the strength ($I_2$) of the back side 14 of the gallium nitride substrate 10 (Step S1); measuring the thickness d of the damaged layer 16 formed on the back side 14 (Step S2); and determining as conforming products a plurality of gallium nitride substrates 10 that satisfy the conditions that the thickness d of the damaged layer 16 is 30 µm or less and the ratio $I_2/I_1$ is 0.46 or more, and the remainder as rejected items (Step S3). Gallium nitride substrates 10 determined to be conforming items by this testing method are fracture-resistant. Here, the sequence of Steps S1 and S2 is not particularly limited and, for example, Step S2 may precede Step S1.

While one embodiment of the present invention has been explained in the foregoing, specific modes by which the present invention can be adopted are not limited in any way to the foregoing example.

For example, the back side 14 of the gallium nitride substrate 10 may be polished to a mirrorlike finish. In this case, that the back side 14 preferably is polished before the front side 12 in order to reduce scratches and contamination on the front side 12. Alternatively, the back side 14 may be polished to a mirrorlike finish simultaneously with the front side 12. Polishing the back side 14 to a mirrorlike finish, however, increases manufacturing costs. Therefore, the back side 14 of the gallium nitride substrate 10 preferably is not polished to a mirrorlike finish, in which case the manufacturing time can be shortened, and the front side 12 can be readily distinguished from the back side 14.

EMBODIMENTS

While the following explains the present invention more specifically on the basis of embodiments and comparative examples, the present invention is not limited the following embodiments.

Embodiment 1

An ingot composed of hexagonal single-crystal GaN of crystal was sliced to obtain 2-inch diameter single-crystal GaN substrates. Herein, the ingot was sliced at intervals preestablished so that after the single-crystal GaN substrates underwent later-described dry etching they would be 350 µm in thickness. At the same time, the ingot was sliced along a direction predetermined so that the thickness orientation of the single-crystal GaN substrate would be in the [0001] direction.

Thereafter, the back side of the single-crystal GaN substrates was mechanically polished with a #400 diamond abrasive (45 µm average particle diameter). Furthermore, the front side of the single-crystal GaN substrate was planarized with an MA-300D made by Musashino Electronics, Inc.

Subsequently, the back side of the single-crystal GaN substrates was dry-etched by RIE. Specifically, the dry etch was carried out employing Ar gas under power 200 W, pressure $10 \times 10^{-3}$ torr conditions. Therein, the dry etching was performed so that the thickness of the damaged layer formed by polishing and other mechanical processes on the back side of the single-crystal substrate would be 30 µm. In this way, a single-crystal GaN substrate, 50 mm in diameter and 350 μm in thickness, of Embodiment 1 was obtained.

Here, the thickness of the damaged layer was calculated by separately manufacturing a single-crystal GaN substrate of Embodiment 1 and carrying out a cathodoluminescence measurement on a cross-section of the GaN substrate. First, a GaN single-crystal substrate having damage was split to enable a cross-section thereof to be evaluated, and the substrate section was placed under a scanning electron microscope (SEM) equipped with a MonoCL3 cathodoluminescence system from Oxford Inc. Subsequently, the substrate section was irradiated with an electron beam to measure its secondary electron image. Next, the cathodoluminescence was measured at the same site as the site that which was irradiated with the electron beam. Because the cathodoluminescence is not as pronounced where damage is present, the thickness of the damaged layer was assayed from a comparison between cathodoluminescence and the secondary electron image Embodiment 2

Single-crystal GaN substrates for Embodiment 2 were obtained likewise as with Embodiment 1, except that the dry etching was performed so that the damaged layer would be 20 μm in thickness.

Embodiment 3

Single-crystal GaN substrates for Embodiment 3 were obtained likewise as with Embodiment 1, except that the dry etching was performed so that the damaged layer would be 10 μm in thickness.

COMPARATIVE EXAMPLE 1

Single-crystal GaN substrates for Comparative Example 1 were obtained likewise as with Embodiment 1, except that the dry etching was performed so that the damaged layer would be 42 μm in thickness.

COMPARATIVE EXAMPLE 2

Single-crystal GaN substrates for Comparative Example 2 were obtained likewise as with Embodiment 1, except that the dry etching was performed so that the damaged layer would be 38 μm in thickness.

COMPARATIVE EXAMPLE 3

Single-crystal GaN substrates for Comparative Example 3 were obtained likewise as with Embodiment 1, except that the dry etching was performed so that the damaged layer would be 34 μm in thickness.

EXPERIMENTAL EXAMPLE

An ingot composed of hexagonal single-crystal GaN was sliced, whereby 2-inch diameter single-crystal GaN substrate was obtained. Herein, the ingot was sliced at intervals preestablished so that after the single-crystal GaN substrates underwent later-described dry etching they would be 350 μm in thickness. At the same time, the ingot was sliced along a direction predetermined so that the thickness orientation of the single-crystal GaN substrate would be in the [0001] direction.

Thereafter, the back side of the single-crystal GaN substrate was mechanically polished with a #400 diamond abrasive.

Subsequently, the front and back sides of single-crystal GaN substrate were dry-etched by RIE. Specifically, the dry etch was carried out employing Ar gas under power 200 W, pressure $10 \times 10^{-3}$ torr, and 20-minute etch time conditions. Furthermore, the single-crystal GaN substrate is immersed into 5% $NH_4OH$ solution at 40° C. for 15 minutes. An experimental GaN single-crystal substrate sample on which no damaged layer was formed on the front or back sides was thus obtained.

Testing

A strength measurement device as illustrated in FIG. 2 (strength meter equipped with a digital force gauge ZSP made by Imada) was utilized to measure the front-side strength ($I_1$) and back-side strength ($I_2$) of the single-crystal GaN substrates of Embodiments 1 and 2, Comparative Examples 1-3, and the experimental example. In the measurement, a 10-mm diameter rod having a hemispheroidal tip of radius (R) 5 mm was utilized. The ratio $I_2/I_1$ was calculated from the obtained front-side strengths ($I_1$) and back-side strengths ($I_2$). Table I sets forth the results.

Additionally, three reference substrates were prepared respectively for Embodiments 1-3, Comparative Examples 1-3, and the experimental example. The load at which the reference substrates fractured in the strength measurement device was applied to the front side of the embodiment-example, comparative example, and experimental example GaN single-crystal substrates. The number of substrates that thereby fractured among three samples was counted. Table I sets forth the results.

TABLE I

| | Damaged layer thickness (μm) | Ratio $I_2/I_1$ | Fractured substrate count (# of plates) | Warpage (μm) |
|---|---|---|---|---|
| Comp. Ex. 1 | 42 | 0.38 | 3 | 25 |
| Comp. Ex. 2 | 38 | 0.42 | 3 | 23 |
| Comp. Ex. 3 | 34 | 0.44 | 1 | 20 |
| Embod. 1 | 30 | 0.46 | 0 | 17 |
| Embod. 2 | 20 | 0.5 | 0 | 13 |
| Embod. 3 | 10 | 0.69 | 0 | 9 |
| Experimental Example | 0 | 0.98 | 0 | 3 |

Embodiment 4

Single-crystal GaN substrates for Embodiment 4 were obtained likewise as with Embodiment 1, except that the back sides of the single-crystal GaN substrate were polished with #300 (60 μm average particle diameter) diamond abrasive.

Embodiment 5

Single-crystal GaN substrates for Embodiment 5 were obtained likewise as with Embodiment 3, except that the back sides of the single-crystal GaN substrate were polished with #300 diamond abrasive.

COMPARATIVE EXAMPLE 4

Single-crystal GaN substrates of Comparative Example 4 were obtained likewise as with Comparative Example 2, except that the back sides of the single-crystal GaN substrate were polished with #300 diamond abrasive.

Testing

A strength measurement device as illustrated in FIG. 2 was utilized to measure the front-side strength ($I_1$) and back-side strength ($I_2$) of the single-crystal GaN substrates of Embodiments 4 and 5, and Comparative Example 4. Then the ratio $I_2/I_1$ was calculated from the obtained front-side strengths ($I_1$) and back-side strengths ($I_2$). Table II sets forth the results.

Additionally, three reference substrates were prepared respectively for Embodiments 4 and 5, and Comparative Example 4. The load at which the reference substrates fractured in the strength measurement device was applied to the front side of the embodiment-example and comparative example GaN single-crystal substrates. The number of substrates that thereby fractured among three samples was counted. Table II sets forth the results.

Furthermore, a flatness tester was employed to measure the warpage of the front side of the single-crystal GaN substrates of Embodiments 4 and 5, and Comparative Example 4. Table II sets forth the results.

TABLE II

|  | Damaged layer thickness (μm) | Ratio $I_2/I_1$ | Fractured substrate count (# of plates) | Warpage (μm) |
| --- | --- | --- | --- | --- |
| Comp. Ex. 4 | 38 | 0.40 | 3 | 24 |
| Embod. 4 | 30 | 0.44 | 1 | 18 |
| Embod. 5 | 10 | 0.65 | 0 | 11 |

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A gallium nitride substrate provided with a first surface polished to a mirrorlike finish, and a second surface on the substrate side that is the opposite of the first-surface side, with a damaged layer of greater than 0 μm but not more than 30 μm thickness being formed on the second surface, such that letting the fracture strength of the first surface be $I_1$ and that of the second surface be $I_2$, the ratio $I_2/I_1$ is 0.46 or more but less than 1.0.

2. A gallium nitride substrate provided with a first surface polished to a mirrorlike finish, and a second surface on the side that is the opposite of the first-surface side, with a damaged layer of greater than 0 μm but not more than 10 μm thickness being formed on the second surface, such that letting the fracture strength of the first surface be $I_1$ and that of the second surface be $I_2$, the ratio $I_2/I_1$ is 0.69 or more but less than 1.0.

3. A gallium-nitride-substrate manufacturing method comprising:
   a step of polishing a first surface of the gallium nitride substrate to a mirrorlike finish;
   a step of processing a second surface on the side that is the opposite of the first-surface side, to form a damaged layer on the second surface; and
   a step of etching the damaged layer so that the thickness of the damage layer will be 30 μm or less but greater than 0 μm, and so that, letting the fracture strength of the first surface be $I_1$ and the fracture strength of the second surface be $I_2$, the ratio $I_2/I_1$ will be 0.46 or more but less than 1.0.

* * * * *